(12) United States Patent
Hook et al.

(10) Patent No.: US 8,012,848 B2
(45) Date of Patent: Sep. 6, 2011

(54) TRENCH ISOLATION AND METHOD OF FABRICATING TRENCH ISOLATION

(75) Inventors: Terence Blackwell Hook, Jericho, VT (US); Jeffrey Bowman Johnson, Essex Junction, VT (US); James Spiros Nakos, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 793 days.

(21) Appl. No.: 11/839,585

(22) Filed: Aug. 16, 2007

(65) Prior Publication Data

US 2009/0045468 A1 Feb. 19, 2009

(51) Int. Cl.
*H01L 21/76* (2006.01)
(52) U.S. Cl. .......... 438/430; 438/221; 438/223
(58) Field of Classification Search ............... 438/199, 438/218, 219, 221, 223, 430, 435; 257/508
See application file for complete search history.

(56) References Cited

U.S. PATENT DOCUMENTS

| | | | |
|---|---|---|---|
| 5,382,541 A * | 1/1995 | Bajor et al. | 438/427 |
| 6,133,611 A * | 10/2000 | Yamaguchi | 257/374 |
| 6,946,359 B2 * | 9/2005 | Yang et al. | 438/425 |
| 7,018,907 B2 * | 3/2006 | Lee | 438/430 |
| 7,157,322 B2 * | 1/2007 | Imai | 438/197 |
| 7,723,204 B2 * | 5/2010 | Khemka et al. | 438/430 |
| 2002/0167066 A1 * | 11/2002 | Ueno et al. | 438/430 |
| 2005/0101100 A1 | 5/2005 | Kretchmer et al. | |
| 2006/0019452 A1 | 1/2006 | Hwang et al. | |
| 2006/0027876 A1 | 2/2006 | Jung et al. | |
| 2006/0113547 A1 | 6/2006 | Shin | |
| 2007/0007571 A1 | 1/2007 | Lindsay et al. | |

OTHER PUBLICATIONS

Sivaram, S., "Comparison of mechanical and microstructural properties of hydrogen and silane reduced low pressure chemical vapor deposited tungsten films," Jan./Feb. 1993, J. Vac. Sci. Technol. A, 11(1), p. 87-95.*

* cited by examiner

*Primary Examiner* — Charles D Garber
*Assistant Examiner* — Bryan R Junge
(74) *Attorney, Agent, or Firm* — Schmeiser, Olsen & Watts; David Cain

(57) ABSTRACT

Trench isolation structure and method of forming trench isolation structures. The structures includes a trench in a silicon region of a substrate, the trench extending from a top surface of the substrate into the silicon region; an ion implantation stopping layer over sidewalls of the trench; a dielectric fill material filling remaining space in the trench, the dielectric fill material not including any materials found in the stopping layer; an N-type dopant species in a first region of the silicon region on a first side of the trench; the N-type dopant species in a first region of the dielectric material adjacent to the first side of the trench; a P-type dopant species in a second region of the silicon region on a second side of the trench; and the P-type dopant species in a second region of the dielectric material adjacent to the second side of the trench.

6 Claims, 9 Drawing Sheets

TRENCH ISOLATION AND METHOD OF FABRICATING TRENCH ISOLATION

FIELD OF THE INVENTION

The present invention relates to the field of integrated circuits and method of fabricating integrated circuits; more specifically, it relates to a trench isolation structure of integrated circuits and method of fabricating trench isolation during integrated circuit manufacture.

BACKGROUND OF THE INVENTION

Complementary metal-oxide-silicon (CMOS) based integrated circuits utilize p-channel field effect transistors (PFETs) and n-channel field effect transistors (NFETs). Many integrated circuit designs require the devices (i.e., the PFETs and NFETs) to be placed adjacent to each other, which is accomplished by isolating the PFETs and NFETs with trench isolation. Trench isolation is essentially a dielectric filled trench formed in the silicon substrate that surrounds the perimeter of and electrically isolates the regions of the PFETs and NFETs formed in the silicon substrate from each other.

However, with the ever increasing need for increased device density, the width of the trench isolation between adjacent devices is decreasing and defect free isolation structures are becoming more difficult to fabricate. Accordingly, there exists a need in the art to improve the trench isolation structure and fabrication methodologies to keep pace with the decreasing dimensions of the trench isolation.

SUMMARY OF THE INVENTION

A first aspect of the present invention is a method, comprising: (a) forming a trench in a silicon region of a substrate, the silicon region adjacent to a top surface of the substrate, the trench extending from the top surface of the substrate into the silicon region; (b) forming a stopping layer on sidewalls and a bottom of the trench; (c) removing the stopping layer from the bottom of the trench; (d) filling remaining space in the trench with a dielectric fill material, the dielectric fill material not including any materials found in the stopping layer; (e) performing an N-type ion implantation on a first side of the trench into a first region of the silicon region abutting the first side of the trench and into a first region of the dielectric material abutting the stopping layer on the first side of the trench; and (f) performing a P-type ion implantation on an second side of the trench into a second region of the silicon region abutting the second side of the trench and into a second region of the dielectric material abutting the stopping layer on the second side of the trench, the second side of the trench opposite the first side of the trench.

A second aspect of the present invention is a method comprising: (a) forming a trench in a silicon region of a substrate, the silicon region adjacent to a top surface of the substrate, the trench extending from the top surface of the substrate into the silicon region; (b) forming an insulating layer on sidewalls and a bottom of the trench; (c) forming a stopping layer on the insulating layer; (d) filling remaining space in the trench with a dielectric fill material, the dielectric fill material not including any materials found in the stopping layer; (e) performing an N-type ion implantation on a first side of the trench into a first region of the silicon region abutting the first side of the trench and into a first region of the dielectric material abutting the insulating layer on the first side of the trench; and (f) performing a P-type ion implantation on an second side of the trench into a second region of the silicon region abutting the second side of the trench and into a second region of the dielectric material abutting the stopping layer on the second side of the trench, the second side of the trench opposite the first side of the trench.

A third aspect of the present invention is a structure, comprising: a trench in a silicon region of a substrate, the silicon region adjacent to a top surface of the substrate, the trench extending from the top surface of the substrate into the silicon region; a stopping layer over sidewalls of the trench; a dielectric fill material filling remaining space in the trench, the dielectric fill material not including any materials found in the stopping layer; an N-type dopant species in a first region of the silicon region on a first side of the trench; the N-type dopant species in a first region of the dielectric material adjacent to the first side of the trench; a P-type dopant species in a second region of the silicon region on a second side of the trench, the second side of the trench opposite the first side of the trench; and the P-type dopant species in a second region of the dielectric material adjacent to the second side of the trench.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1A:
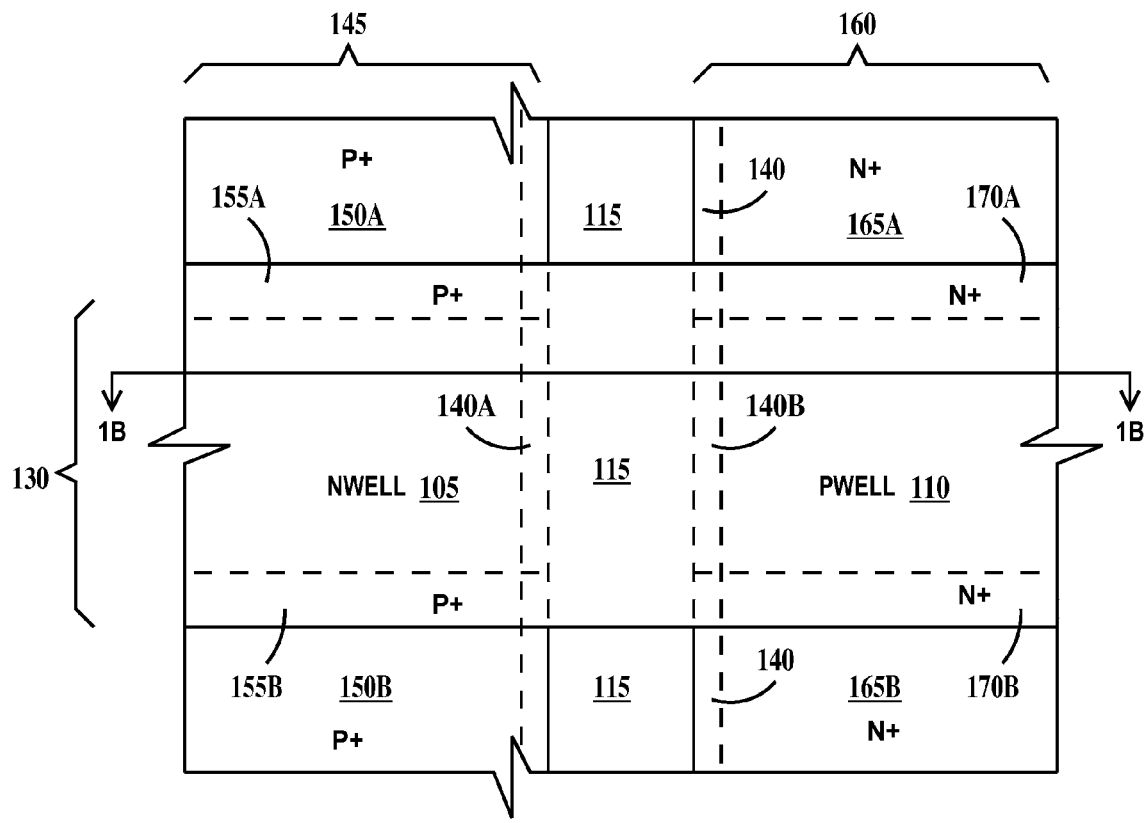
FIG. 1A is a top view and FIG. 1B is a cross-sectional view through line 1B-1B of FIG. 1A illustrating a defect mechanism related to the decreasing the width of trench isolation.
Figure 1B:
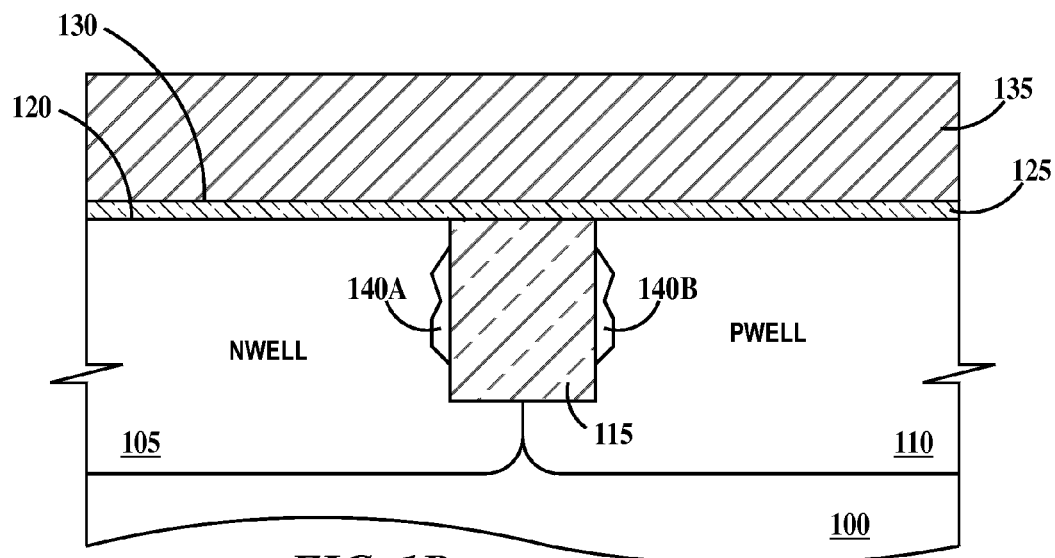

FIG. 1A is a top view and FIG. 1B is a cross-sectional view through line 1B-1B of FIG. 1A illustrating a defect mechanism related to the decreasing width of the trench isolation. In FIGS. 1A and 1B, a semiconductor substrate 100 includes an N-well region 105 and a P-well region 110 separated by dielectric trench isolation 115. Note N-well 105 and P-well 110 abut under trench isolation 115. Formed on a top surface 120 of substrate 100 is a gate dielectric layer 125 and formed on a top surface 130 of the gate dielectric layer is an electrically conductive gate electrode 135.

A PFET 145 is formed in N-well 105. PFET 145 includes first and second source/drain 150A and 150B formed in N-well 105 on opposite sides of gate electrode 135 and first and second source/drain extensions 155A and 155B formed in the N-well under opposite edges of the gate electrode. First and second source/drains 155A and 155B abut trench isolation 115 and extend from top surface 120 of substrate 100 into N-well 105, but not through the bottom of the N-well. First and second source/drain extensions 155A and 155B abut trench isolation 115 and abut first and second source/drains 150A and 150B and extend from top surface 120 of substrate 100 into N-well 105, but not as far into the N-well as first and second source/drains 155A and 155B. First and second source/drains 155A and 155B and first and second source/drain extensions 155A and 155B are doped P-type. N-well 105 is doped N-type and forms the channel region of PFET 145.

An NFET 160 is formed in N-well 105. NFET 160 includes first and second source/drain 165A and 165B formed in P-well 110 on opposite sides of gate electrode 135 and first and second source/drain extensions 170A and 170B formed in the P-well under opposite edges of the gate electrode. First and second source/drains 170A and 170B abut trench isolation 115 and extend from top surface 120 of substrate 100 into P-well 110, but not through the bottom of the P-well. First and second source/drain extensions 170A and 170B abut trench isolation 115 and abut first and second source/drains 165A and 165B and extend from top surface 120 of substrate 100 into P-well 110, but not as far into the P-well as first and second source/drains 170A and 170B. First and second source/drains 170A and 170B and first and second source/drain extensions 170A and 170B are doped N-type. P-well 110 is doped P-type and forms the channel region of NFET 160.

Generally, N-well 105 and P-well 115 are formed by separate ion-implantations of dopant species through respective blocking layers whose edges overlay an already formed trench isolation 115. However, ion-implantation is subject to straggle. Straggle is the deflection of implanted species from their original trajectories as they penetrate into the target material, in the present case, N-well 105 and trench isolation 115 or P-well 110 and trench isolation 115. If the width of trench isolation 115 between N-well and P-well 110 is too small, then P-type regions 140A can form along the edges of the trench isolation in N-well 105 due to straggle of the P-well implant in trench isolation 115 and N-type regions 140B can form along the edges of the trench isolation in P-well 110 due to straggle of the N-well implant in trench isolation 115. P-type regions 140A can cause leakage between the first and second source/drains 150A and 150B of PFET 145 and N-type regions 140A can cause leakage between the first and second source/drains 165A and 165B of NFET 160.

The defect mechanism (regions 140A and 140B) illustrated in FIGS. 1A and 1B and described supra, were discovered by the inventors by studies related to measurement of NFET leakage currents that behaved as depletion layer punch through, but only for NFET devices proximate to PFET devices, and was found to track with certain of the N-well ion-implantation doses and was confirmed by running simulation models.

FIGS. 2A through 2J are cross-sectional drawings illustrating fabrication of trench isolation and device structures according to a first embodiment of the present invention. In FIG. 1A, formed on a top surface 195 of a substrate 200 is a pad later 205. Pad layer 205 acts as an etch stop layer, a polish stop layer and a hardmask layer. Pad layer 205 may comprise multiple layers. In one example, substrate 200 is single-crystal silicon. In one example, pad layer 205 comprises a layer of silicon nitride over a layer of silicon dioxide, the silicon dioxide contacting substrate 200.

Figure 2A:
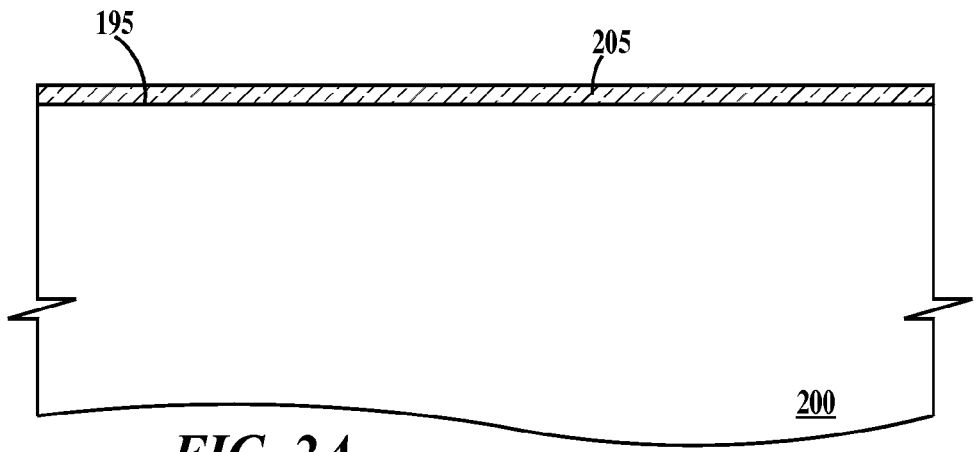
FIGS. 2A through 2J are cross-sectional drawings illustrating fabrication of trench isolation and device structures according to a first embodiment of the present invention.
Figure 2B:
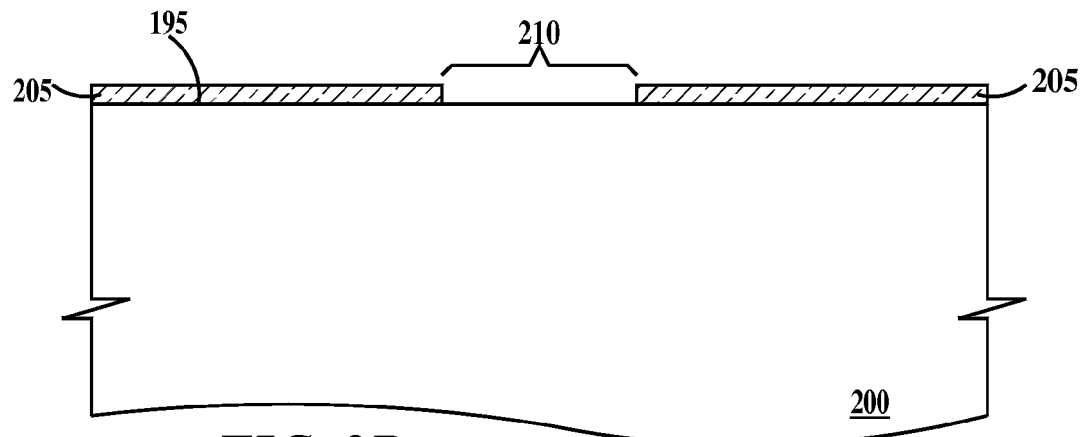

In FIG. 2B an opening 210 is formed in pad layer 210 to expose top surface 195 of substrate 200 in the opening. Opening 200 is in the pattern of the trench isolation required for the integrated circuit being fabricated. Opening 210 may be formed photolithographically by (1) forming a photoresist layer on top of the pad layer, (2) exposing the photoresist layer to actinic radiation through a patterned photomask, (3) developing the photoresist layer to transfer the pattern of the photomask into the photoresist layer, (4) etching (e.g., reactive ion etching (RIE)) though the pad layer not protected by the patterned photoresist layer, (5) removing the photoresist layer.

Figure 2C:
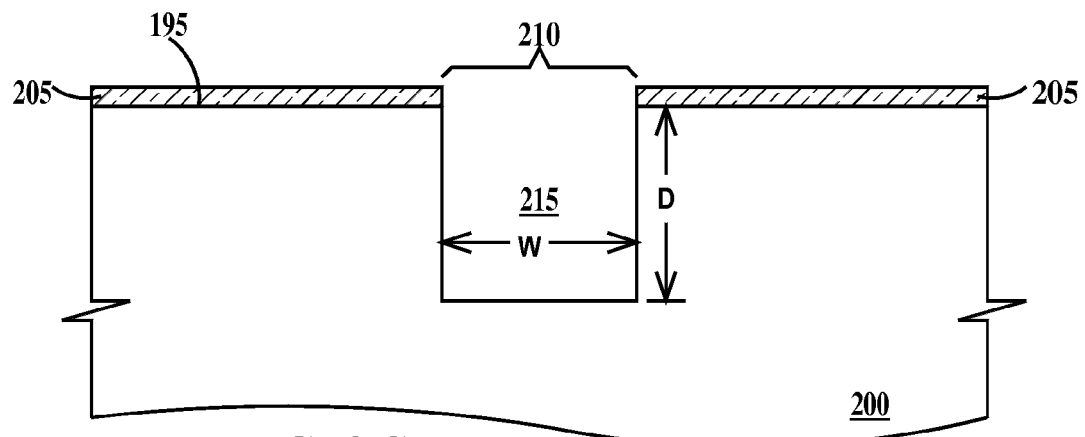

In FIG. 2C, a trench 215 is etched into substrate 200 through opening 210 in pad layer 205. Trench 215 has a depth D and a width W (where an N-well and a P-Well will be subsequently formed). In one example, trench 215 is formed by a RIE process. In one example D is less than about 350 nm and W is less than about 120 nm. In one example the ratio of D/W is equal to or greater than 3.

Figure 2D:
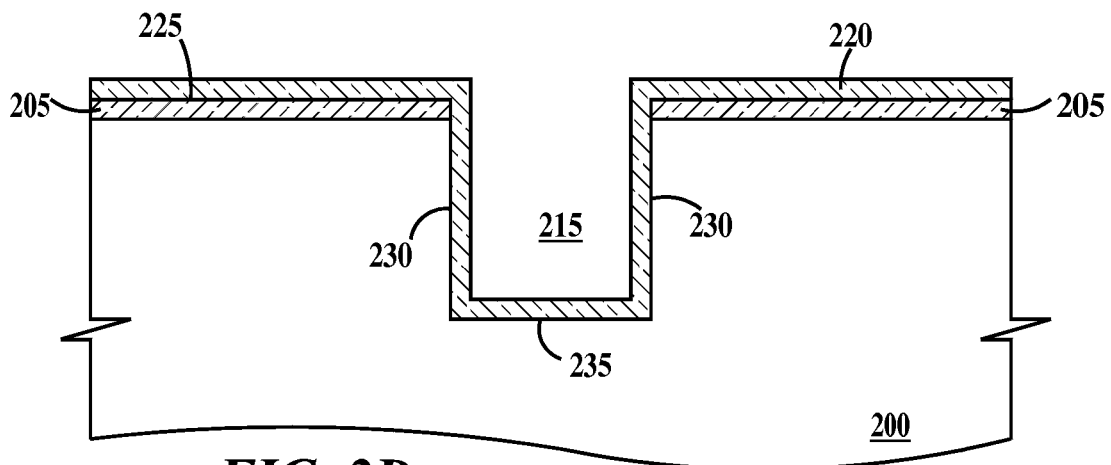

In FIG. 2D, a stopping layer 220 is conformally formed over top surface 225 of pad layer 205 and the sides 230 and bottom 235 of trench 215. Stopping layer 220 comprises a material with a high ion implantation stopping power (e.g., is of sufficient density to prevent ions of P and N type dopant species to be later ion-implanted into the then filled trench 215 from penetrating into substrate 200 through stopping layer 220 on sidewalls 230 of trench 215). Stopping power is a measure of the thickness of a given layer of material needed to stop 100% of the ions implanted into the layer within the layer. Calculations of stopping power can be complex, but to a first order, stopping power is related to the density of the material of the layer. Stopping layer 220 is a dielectric material. Examples of suitable materials for stopping layer 220 include but are not limited to aluminum oxide ($Al_2O_3$), silicon carbide, hafnium oxide ($HfO_2$) hafnium carbide, hafnium silicate ($HfSi_xO_y$), tantalum oxide ($Ta_2O_5$), zirconium oxide ($ZrO_2$) and combinations thereof. In one example the density of stopping layer 220 is greater than about 3 grams/cm$^3$, preferably greater than about 8 grams/cm$^3$. Stopping layer 220 cannot be silicon dioxide or silicon nitride and are specifically excluded. In one example the thickness of stopping layer 220 is between about 20 nm and about 75 nm. In one example, the thickness of stopping layer 220 is no greater than (W/4) see FIG. 2C. In one example, the thickness of stopping layer 220 is selected based on the density of the material of the stopping layer and the ion implant energy (e.g., KeV) of the implanted species.

Figure 2E:
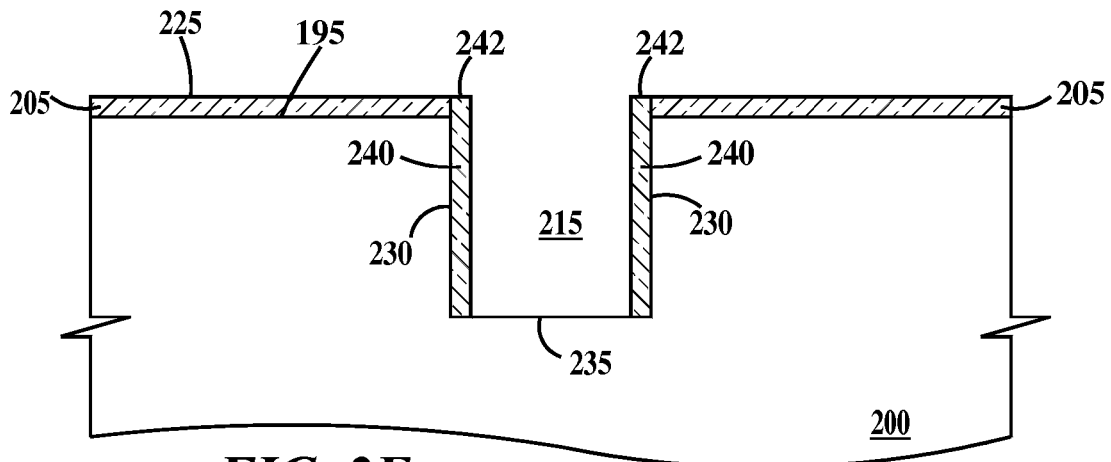

In FIG. 2E, etch stop later 220 (see FIG. 2D) has been removed from top surface 225 of pad layer 205 and bottom 235 of trench 215 to form sidewall liner 230 on the sides 230 of the trench. This may be accomplished using an RIE process. In one example, the RIE process etches stopping layer 220 selective to substrate 200 (e.g., selective to silicon) and/or pad layer 205. (Etching a first layer "selective to" a second layer means a process that etches the first layer (e.g., stopping layer 220) faster than the second layer (e.g., substrate 200 and/or pad layer 205) or not at all. Sidewall liner 230 may also be called "spacers." While the uppermost edge 242 of sidewall liner 240 are shown co-planar with top surface 225 of pad layer 205, edge 242 may be recessed below top surface 225 or coplanar or recessed below top surface 195 of substrate 200. In one example, it is advantageous that no stopping layer 220 (see FIG. 2D) should remain on the bottom 235 of trench 215, as penetration of the N-well and P-well ion implants described infra into substrate 200 under trench 215 is desirable in many cases.

Figure 2F:
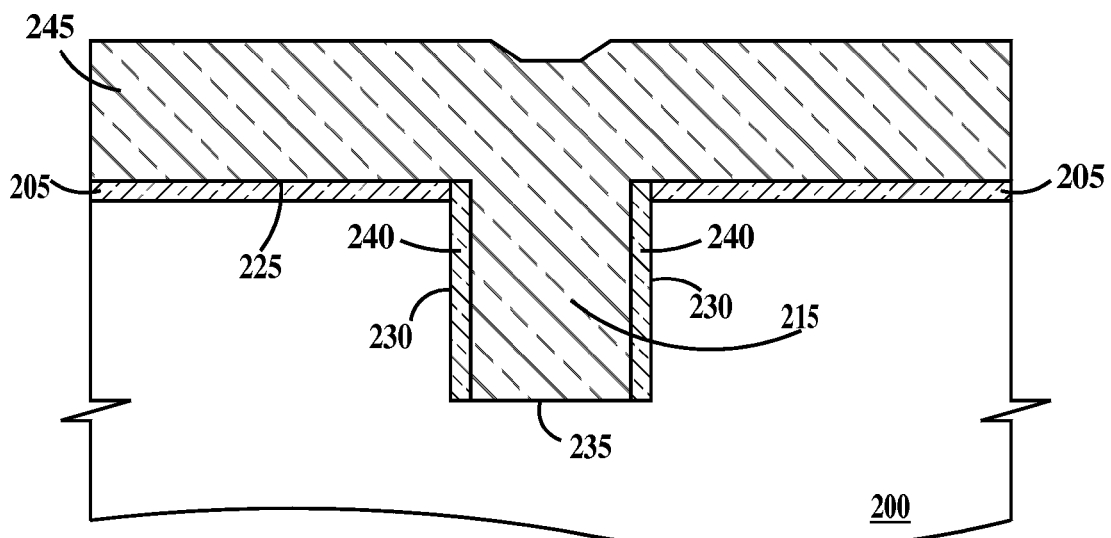

In FIG. 2F, a layer of dielectric fill 245 is formed over all exposed surfaces pad layer 205, sidewall liner 215 and bottom 235 of trench 215. Dielectric fill 245 completely fills the remaining space in trench 215. In one example, dielectric fill 245 is a high density plasma (HDP) silicon dioxide or tetraethoxysilane (TEOS) deposited silicon dioxide. Dielectric fill 245 and stopping layer 220 comprise different materials. In one example, Dielectric fill 245 includes no material found in stopping layer 220.

Figure 2G:
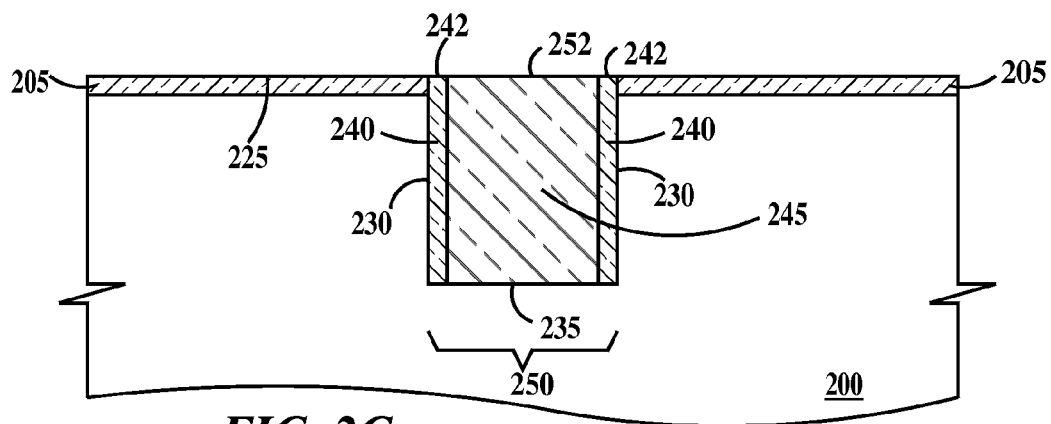

In FIG. 2G, a chemical mechanical polish (CMP) has been performed to form trench isolation 250 comprising sidewall liner 240 and dielectric fill 245. A top surface 252 of trench isolation 250 is coplanar with top surface 225 of pad layer 205. While edges 242 of sidewall liner 240 is illustrated as coplanar with top surface 225 of pad layer 205, if the edges had been recessed as described supra, then the edges would be covered with dielectric fill 245.

Figure 2H:
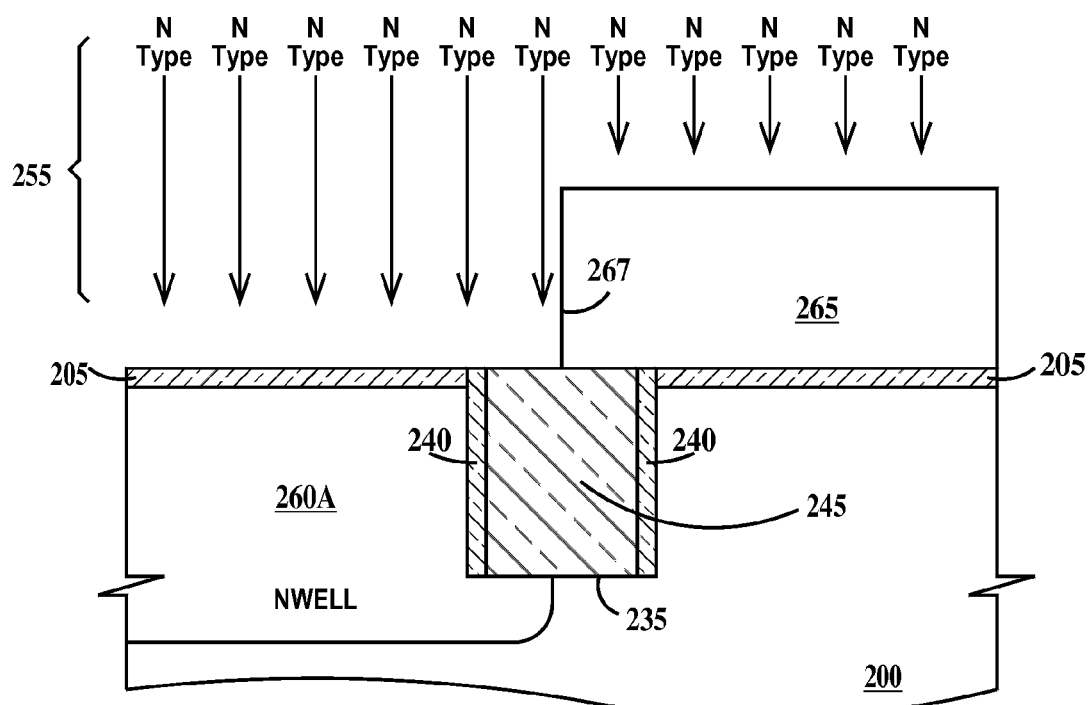

In FIG. 2H, an N-type ion implantation(s) 255 is performed into substrate 200 to form an N-well 260A. A patterned photoresist layer 265 is formed over portions of substrate 200 where it is not desirable to form N-wells prior to the N-type ion implantation(s). An edge 267 of photoresist layer 265 is aligned over dielectric fill 245. Because of sidewall liner 240, little to none of the N-type dopant species implanted into dielectric fill can "straggle" into substrate 200 under photoresist layer 265. Formation of patterned photoresist layers has been described supra. After the ion implantation, photoresist layer 265 is removed.

A typical N-well ion implantation process includes multiple ion-implantations of N-type dopant species at different and progressively lower voltages. For example, three ion implantations of 400 KeV, 250 KeV and 50 KeV at doses in the $10^{12}$ to $10^{13}$ atom/cm$^2$ range.

Figure 2I:
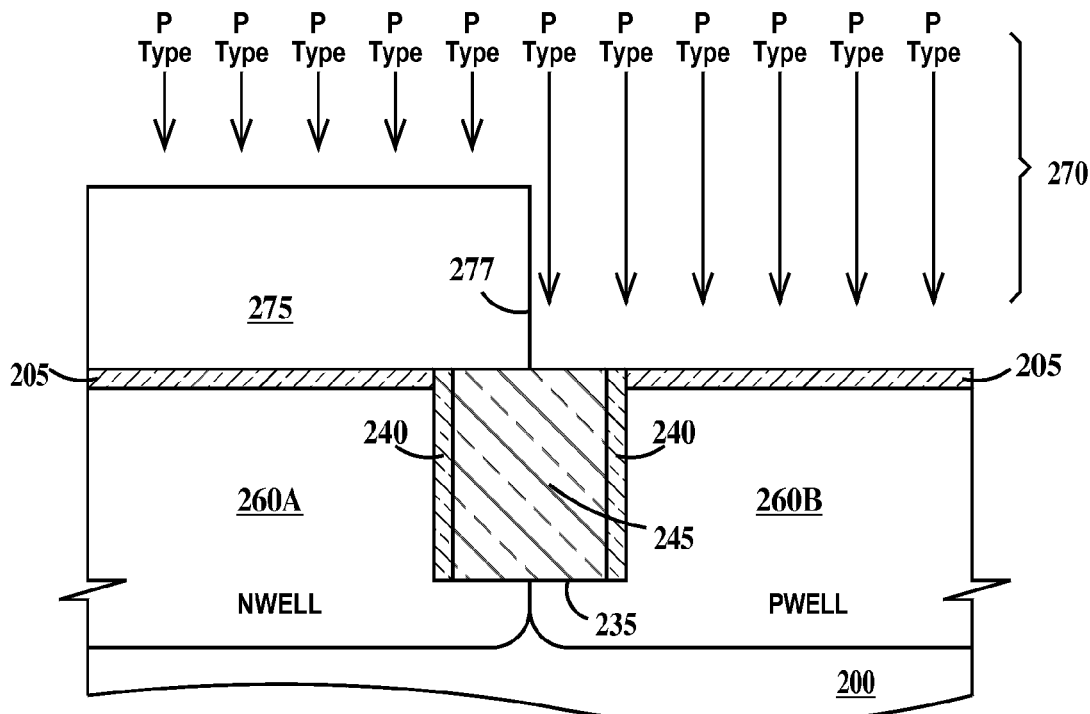

In FIG. 2I, a P-type ion implantation(s) 270 is performed into substrate 200 to form a P-well 260B. A patterned photoresist layer 275 is formed over portions of substrate 200 where it is not desirable to form P-wells prior to the P-type ion implantation(s). An edge 277 of photoresist layer 275 is aligned over dielectric fill 245. Because of sidewall liner 240, little to none of the P-type dopant species implanted into dielectric fill can "straggle" into substrate 200 under photoresist layer 275. Formation of patterned photoresist layers has been described supra. After the ion implantation, photoresist layer 275 is removed.

A typical P-well ion implantation process includes multiple ion-implantations of P-type dopant species at different and progressively lower voltages. For example, three ion implantations of 220 KeV, 120 KeV and 40 KeV at doses in the $10^{12}$ to $10^{13}$ atom/cm$^2$ range.

Note, the P-well ion implantation and related processes may be performed before the N-well ion implantation and related processes.

Figure 2J:
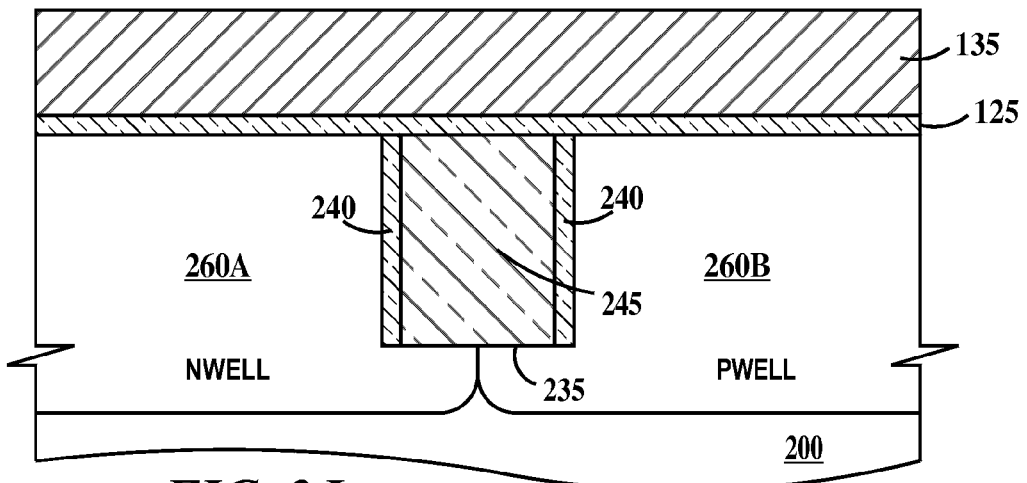

In FIG. 2J, pad layer 275 and PFET and NFET devices are fabricated including gate dielectric layer 125 and gate electrode 135 similar to FIGS. 1A and 1B without the straggle regions 140A and 140B. A simplified process sequence would include: (1) removing the pad layer, (2) forming a gate dielectric layer, (3) forming gate electrodes, (4) forming sidewall spacers on the sides of the gate electrodes, (5) ion implanting the NFET source/drains, (6) ion implanting the PFET source/drains, (7) ion implanting the NFET source/drain extensions, (8) ion implanting the PFET source/drain extensions, (9) forming contacts to the NFET and PFET source/drains and gate electrodes, forming wiring levels to connect the NFETs and PFETs into integrated circuits. The order of the ion implanting steps 5 through 8 may be changed.

Figure 3A:
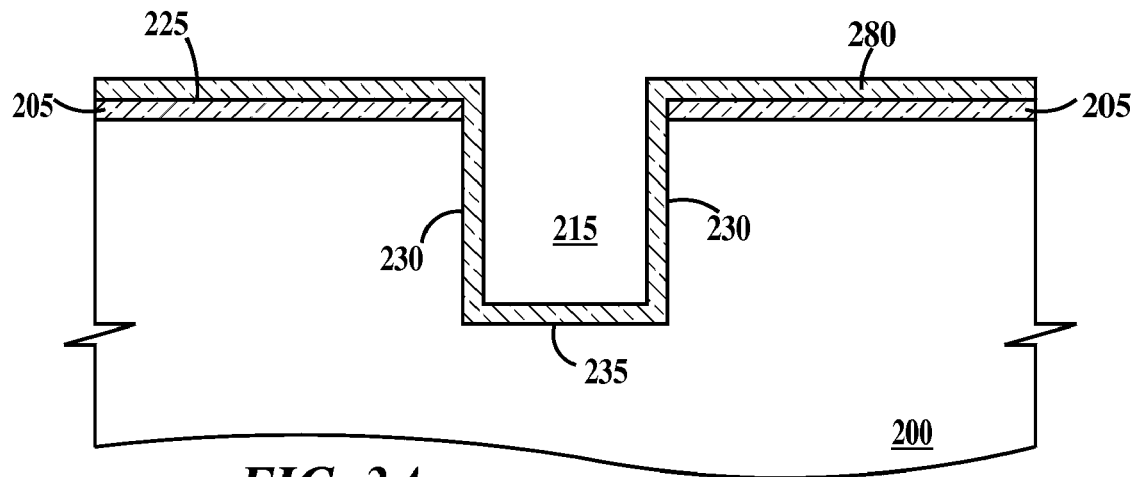
FIGS. 3A through 3C are cross-sectional drawings illustrating fabrication of trench isolation and device structures according to a second embodiment of the present invention.
Figure 3B:
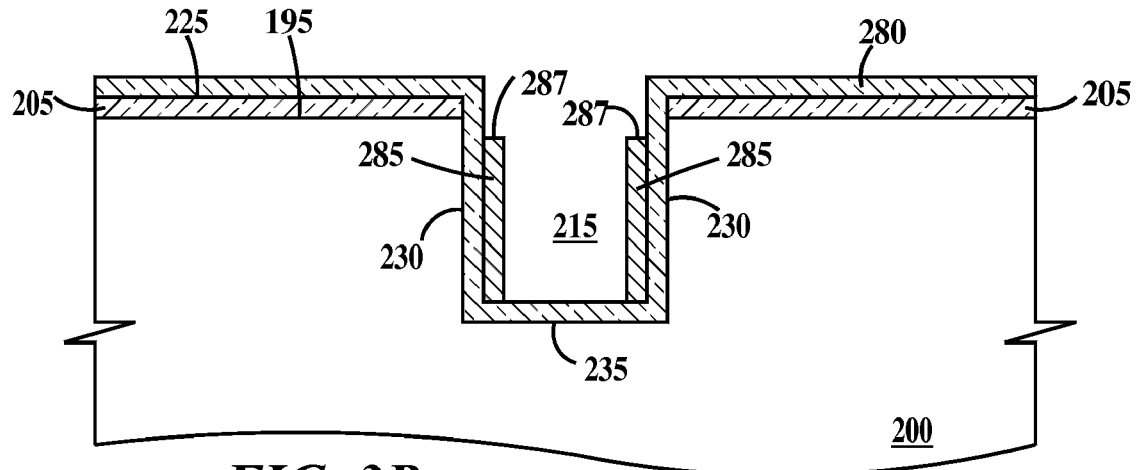
Figure 3C:
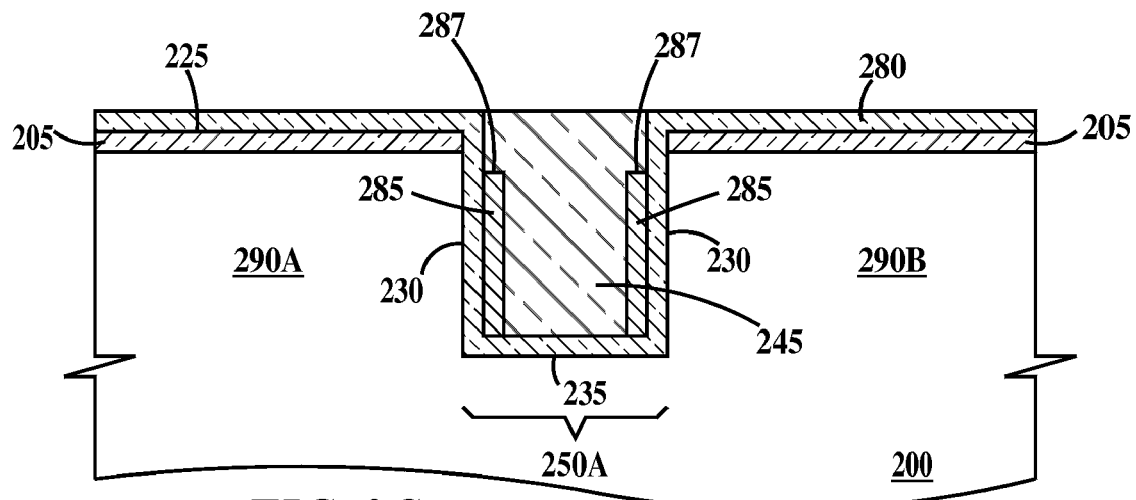

FIGS. 3A through 3C are cross-sectional drawings illustrating fabrication of trench isolation and device structures according to a second embodiment of the present invention. The second embodiment of the present inventions differs from the first embodiment in that it allows the use an electrically conductive (e.g., metal) stopping layer. Metals and electrical conductors generally have greater density and thus stopping power than dielectrics. The steps illustrated in FIGS. 2A through 2C and described supra, are performed prior to the processes illustrated in FIG. 3A.

In FIG. 3A, a insulating layer 280 is conformally formed over top surface 225 of pad layer 205 and the sides 230 and bottom 235 of trench 215. In one example, insulating layer 280 comprises silicon dioxide, silicon nitride or another dielectric material. In one example the thickness of insulating layer 280 is between about 20 nm and about 75 nm. In one example, the thickness of insulating layer 280 is no greater than (W/4) see FIG. 2C.

In FIG. 3B, sidewall liner 285 are formed over insulating layer 280 on sidewalls 230 of trench 215. Sidewall liner 285 may be formed by conformally depositing a layer of liner material and performing a RIE to remove the horizontal portions (relative to top surface 195 of substrate 200) of the layer of liner material. Insulating layer 280 prevents sidewall liner 285 from shorting to substrate 200. It is advantageous for uppermost edges 287 of sidewall liner 285 to be recessed below top surface 195 of substrate 200 to avoid electrical contact to subsequently formed gate electrodes. Examples of suitable materials for sidewall liner 285 include but are not limited to nickel, cobalt, copper, chromium, molybdenum, germanium, palladium, silver, hafnium, tungsten, tungsten carbide, tungsten nitride, gold, platinum, and combinations thereof. In one example the density of sidewall liner 285 is greater than about 8 grams/cm$^3$, preferably greater than about 12 grams/cm$^3$. In one example the thickness of sidewall liner 285 measured in a direction parallel to top surface 195 of substrate 200 is between about 20 nm and about 75 nm. In one example, the thickness of sidewall liner 285 is no greater than (W/4) see FIG. 2C.

In FIG. 3C, the processes illustrated in FIGS. 2F and 2G and described supra are performed to form trench isolation 250A comprising insulating layer 280, sidewall liner 285 and dielectric fill 245. The processes illustrated in FIGS. 2H through 2J and described supra, are next performed after the step illustrated in FIG. 3C with an N-well being formed in region 290A and a P-well being formed in region 290B of substrate 200.

In a variant of the third embodiment of the present invention, stopping layer 220 is sufficiently thick to completely fill trench 215 and no dielectric fill 245 is required.

Figure 4A:
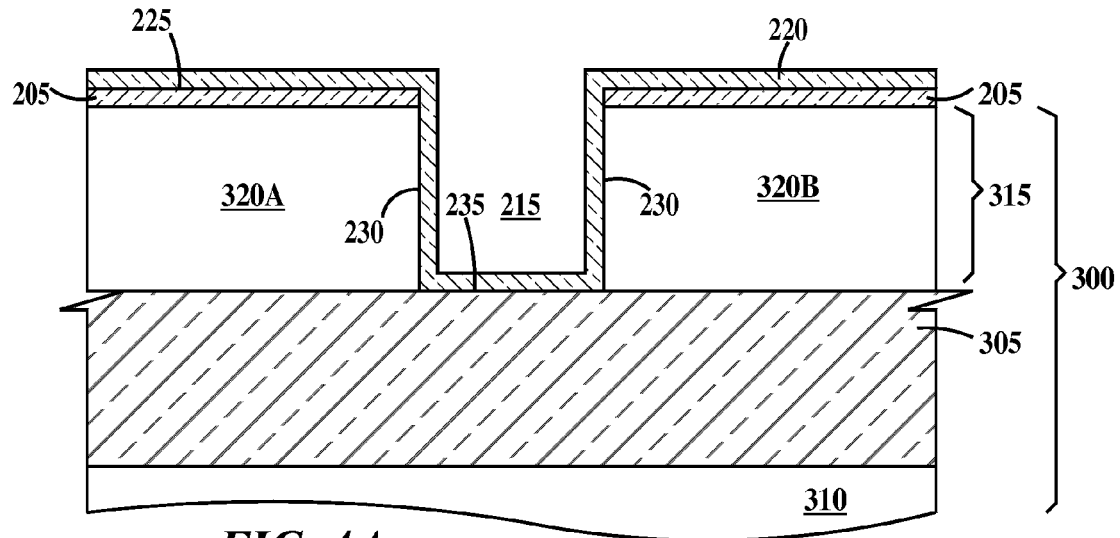
FIGS. 4A and 4B are cross-sectional drawings illustrating fabrication of trench isolation and device structures according to a third embodiment of the present invention.
Figure 4B:
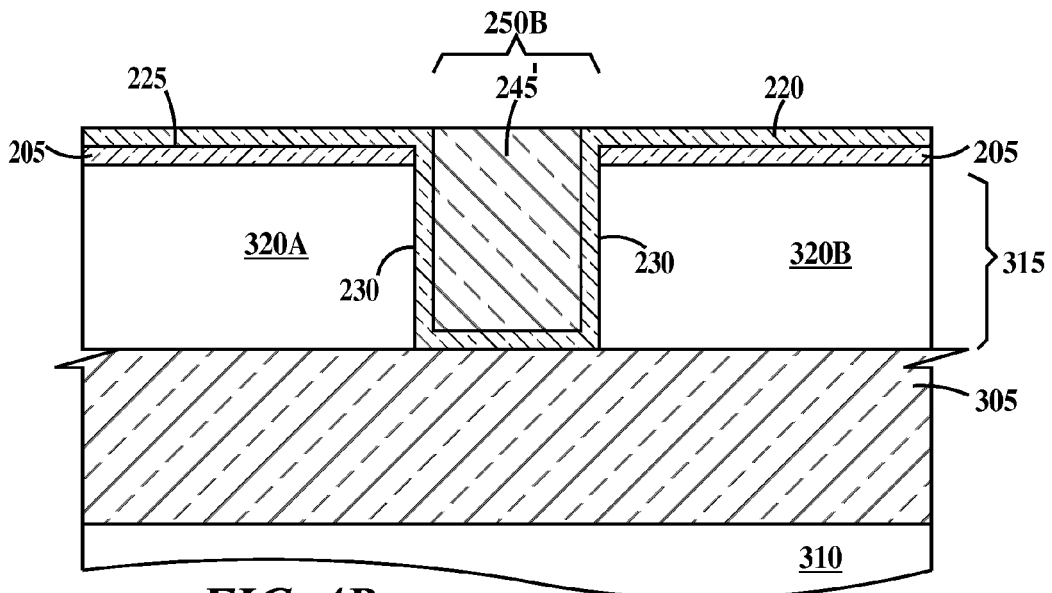

FIGS. 4A and 4B are cross-sectional drawings illustrating fabrication of trench isolation and device structures according to a third embodiment of the present invention. The third embodiment of the present invention is similar to the first embodiment of the present invention, except, the process has been simplified for use with silicon-on-insulator (SOI) substrates. The steps illustrated in FIGS. 2A through 2C and described supra, are performed prior to the step illustrated in FIG. 4A.

In FIG. 4A, an SOI substrate 300 comprises a buried oxide (BOX) layer 305 between a lower silicon layer 305 and an upper silicon layer 315. Trench 215 reaches to BOX layer 305 and stopping layer 220 is conformally formed on top of regions of BOX layer 305 exposed in bottom 235 of trench 215.

In FIG. 4B, the processes illustrated in FIGS. 2F and 2G and described supra are performed to form trench isolation 250B comprising stopping layer 220 and dielectric fill 245. The processes illustrated in FIGS. 2I through 2J and described supra, are performed after the processes illustrated in FIG. 4B with an N-well being formed in region 320A and a P-well being formed in region 320B of silicon layer 315. Optionally, the CMP step used to remove excess dielectric fill 245 may remove regions of blocking layer 220 in contact with top surface 225 of pad layer 205, or the regions of blocking layer 220 in contact with top surface 225 of pad layer 205 may be removed when pad layer 205 is removed.

Figure 5A:
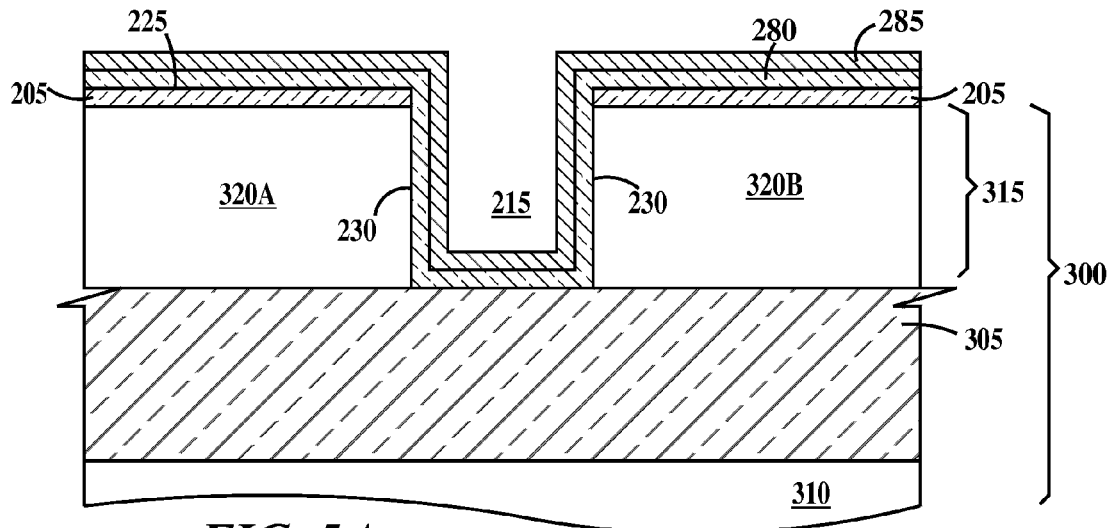
FIGS. 5A through 5C are cross-sectional drawings illustrating fabrication of trench isolation and device structures according to a fourth embodiment of the present invention.
Figure 5B:
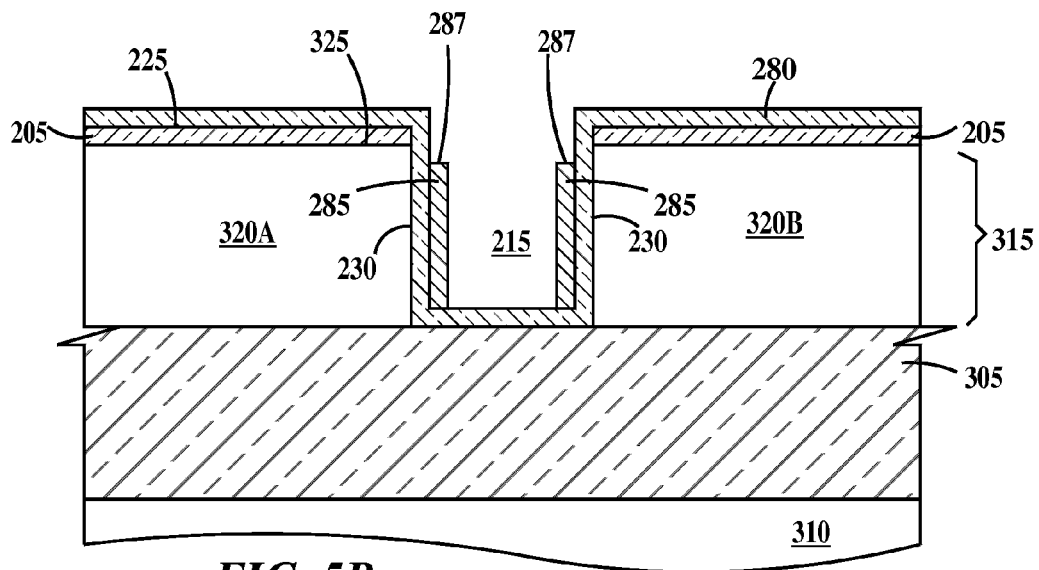
Figure 5C:
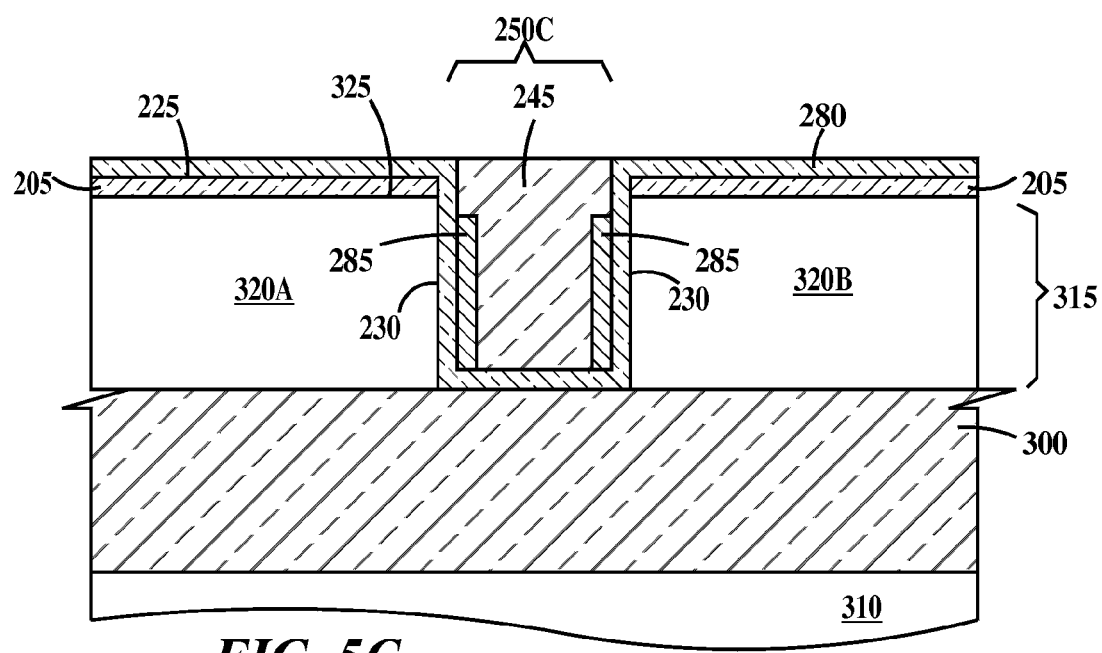

FIGS. 5A through 5C are cross-sectional drawings illustrating fabrication of trench isolation and device structures according to a fourth embodiment of the present invention. The fourth embodiment of the present invention is similar to the second embodiment of the present invention, except, the process has been simplified for use with SOI substrates. The processes illustrated in FIGS. 2A through 2C and described supra, are performed prior to the step illustrated in FIG. 5A.

In FIG. 5A, trench 215 reaches to BOX layer 305 and insulating layer 220 is conformally formed on top of regions of BOX layer 305 exposed in bottom 235 of trench 215. Then stopping layer 285 is conformally formed over insulating layer 280. Insulating layer 280 prevents sidewall liner 285 from shorting to silicon layer 315.

In FIG. 5B, sidewall liner 285 are formed over insulating layer 280 on sidewalls 230 of trench 215 as described supra with respect to FIG. 3B. It is advantageous for uppermost edges 287 of sidewall liner 285 to be recessed below top surface 325 of silicon layer 315 to avoid electrical contact to subsequently formed gate electrodes.

In FIG. 5C, the processes illustrated in FIGS. 2F and 2G and described supra are performed to form trench isolation 250C comprising insulating layer 280, sidewall liner 285 and dielectric fill 245. The processes illustrated in FIGS. 2I through 2J and described supra, are performed after the processes illustrated in FIG. 5C with an N-well being formed in region 320A and a P-well being formed in region 320B of silicon layer 315. Optionally, the CMP step used to remove excess dielectric fill 245 may remove regions of insulating layer 280 in contact with top surface 225 of pad layer 205, or the regions of insulating layer 280 in contact with top surface 225 of pad layer 205 may be removed when pad layer 205 is removed.

In a variant of the fourth embodiment of the present invention, stopping layer 285 is sufficiently thick to completely fill trench 215 and no dielectric fill 245 is required.

Thus the present invention provides trench isolation structures and fabrication methodologies that allow decreasing dimensions of the trench isolation.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, the first and third embodiments of the present invention may be performed on bulk silicon substrates (e.g. substrate 200 of, for example, FIG. 2A). Therefore, it is intended that the following claims cover all such modifications and changes as fall within the true spirit and scope of the invention.

What is claimed is:

1. A method, comprising:
(a) forming a trench in a silicon region of a substrate, said silicon region adjacent to a top surface of said substrate, said trench extending from said top surface of said substrate into said silicon region;
(b) forming an insulating layer over said top surface of said substrate and on sidewalls and a bottom of said trench;
(c) forming a stopping layer on said insulating layer;
(d) removing said stopping layer from regions of said insulating layer over said top surface of said substrate and over said bottom of said trench, said stopping layer remaining on said insulating layer on said sidewalls of said trench, the remaining stopping layer recessed below said top surface of said substrate, said insulating layer exposed in said bottom of said trench;
(e) filling remaining space in said trench with a dielectric fill material, said dielectric fill material not including any materials found in said stopping layer;
(f) performing an N-type ion implantation on a first side of said trench into a first region of said silicon region abutting said first side of said trench and into a first region of said dielectric material abutting said insulating layer on said first side of said trench;
(g) performing a P-type ion implantation on an second side of said trench into a second region of said silicon region abutting said second side of said trench and into a second region of said dielectric material abutting said stopping layer on said second side of said trench, said second side of said trench opposite said first side of said trench; and
wherein said stopping layer comprises a material selected from the group consisting of nickel, cobalt, copper, chromium, molybdenum, palladium, silver, hafnium, tungsten carbide, tungsten nitride, gold, platinum, and combinations thereof.

2. The method of claim 1, wherein said silicon region is a silicon layer on a top surface of a buried oxide layer on a top surface of a silicon support substrate, a region of said buried oxide layer exposed in said bottom of said trench, said insulating layer abutting said region of said buried oxide layer exposed in said bottom of said trench.

3. The method of claim 2, wherein said stopping layer comprising a material with a density of at least 8.0 grams/$cm^3$.

4. The method of claim 2, further including:
(h) forming a source and a drain of a PFET in said first region of said silicon region, said source and said drain of said PFET abutting different regions of said first side of said trench; and
(i) forming a source and a drain of an NFET in said second region of said silicon region, said source and said drain of said NFET said abutting different regions of said second side of said trench.

5. The method of claim 1, wherein said stopping layer comprises tungsten.

6. The method of claim 1, wherein said stopping layer comprises a material with a density of at least 12.0 grams/$cm^3$.

* * * * *